(12) United States Patent
Emira et al.

(10) Patent No.: US 11,698,657 B2
(45) Date of Patent: Jul. 11, 2023

(54) FRACTIONAL CLOCK DIVIDER

(71) Applicant: Shenzhen Goodix Technology Co., Ltd., Shenzhen (CN)

(72) Inventors: Ahmed Emira, San Diego, CA (US); Mohamed Aboudina, San Diego, CA (US); Faisal Hussien, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/710,963

(22) Filed: Mar. 31, 2022

(65) Prior Publication Data

US 2023/0161372 A1    May 25, 2023

Related U.S. Application Data

(60) Provisional application No. 63/281,738, filed on Nov. 22, 2021.

(51) Int. Cl.
| | | |
|---|---|---|
| *G06F 1/08* | (2006.01) | |
| *H03K 5/00* | (2006.01) | |
| *G06F 1/10* | (2006.01) | |
| *H04B 1/04* | (2006.01) | |

(52) U.S. Cl.
CPC .............. *G06F 1/08* (2013.01); *G06F 1/10* (2013.01); *H03K 5/00006* (2013.01); *H03K 2005/00286* (2013.01); *H04B 1/04* (2013.01)

(58) Field of Classification Search
CPC . H03L 7/07; H03L 7/1976; H03L 7/18; H03L 7/087; H03L 7/08; H03L 7/091; H03L 7/0814; H03L 7/16; H03L 7/183; H03L 7/099; H03L 7/23; H03L 7/0812; H03L 7/00; H03L 7/085; H03L 7/1974; H03L 7/0995; H03L 7/0805; H03L 7/10; H03K 5/00006; H03K 5/135; H03K 2005/00286; H03D 7/165; G06F 1/08;
(Continued)

(56) References Cited

U.S. PATENT DOCUMENTS

| | | | | |
|---|---|---|---|---|
| 5,146,186 A | * | 9/1992 | Vella | ........................ H03L 7/23 331/11 |
| 7,212,050 B2 | * | 5/2007 | Meltzer | ................. H03L 7/0816 327/147 |

(Continued)

*Primary Examiner* — John W Poos
(74) *Attorney, Agent, or Firm* — Kilpatrick Townsend & Stockton LLP

(57) ABSTRACT

A communication circuit is disclosed. The communication circuit includes a clock input, and a clock divider configured to generate an output clock signal having a fundamental frequency which is substantially equal to a fundamental frequency of an input clock signal received at the clock input divided by a factor of (2N+1)/2N, where the clock divider is configured to generate 2N+1 pre-aligned phase shifted clock signals based at least in part on the input clock signal, generate 2N unique phase shifted clock signals based at least in part on the 2N+1 pre-aligned phase shifted clock signals, where the 2N unique phase shifted clock signals are substantially separated in phase by 360/2N degrees, and generate the output clock signal based at least in part on the 2N unique phase shifted clock signals, and a mixer, configured to receive the output clock signal.

20 Claims, 10 Drawing Sheets

(58) Field of Classification Search
CPC ..... G06F 1/06; G06F 7/68; G06F 7/66; G06F 7/64; G06F 7/62; H04L 7/0025
See application file for complete search history.

(56) References Cited

U.S. PATENT DOCUMENTS

| | | | | |
|---|---|---|---|---|
| 8,537,952 | B1* | 9/2013 | Arora | H03L 7/1974 375/376 |
| 10,205,457 | B1* | 2/2019 | Josefsberg | H03L 7/091 |
| 2012/0276857 | A1* | 11/2012 | Gao | H03B 19/00 327/119 |

* cited by examiner

FRACTIONAL CLOCK DIVIDER

CROSS REFERENCE TO RELATED APPLICATIONS

This application claims priority to U.S. provisional patent application No. 63/281,738, titled "FRACTIONAL CLOCK DIVIDER," filed on Nov. 22, 2021, which is hereby incorporated by reference in their entirety for all purposes.

TECHNICAL FIELD

The subject matter described herein relates to clock generation, and more particularly to clock generation with fractional division.

BACKGROUND

In some transmitters and receivers mixers are respectively used to convert and downconvert data between, for example RF and baseband frequencies. In some embodiments, the RF frequency may be generated using a feedback controlled frequency generation circuit, which may be sensitive to noise coupled thereto at the fundamental RF frequency or harmonics thereof. Accordingly, it may be beneficial to operate other circuitry at frequencies which are different from the fundamental RF frequency and its harmonics. Accordingly, some circuits use clock division circuits which divide the fundamental RF frequency by a non-integer factor.

SUMMARY

One inventive aspect is a communication circuit. The communication circuit includes a clock input, and a clock divider circuit configured to generate an output clock signal having a fundamental frequency which is substantially equal to a fundamental frequency of an input clock signal received at the clock input divided by a factor of (2N+1)/2N, where N is an integer, and where the clock divider circuit is configured to generate 2N+1 pre-aligned phase shifted clock signals based at least in part on the input clock signal, generate 2N unique phase shifted clock signals based at least in part on the 2N+1 pre-aligned phase shifted clock signals, where the 2N unique phase shifted clock signals are substantially separated in phase by 360/2N degrees, and generate the output clock signal based at least in part on the 2N unique phase shifted clock signals, and a mixer, configured to receive the output clock signal.

In some embodiments, the 2N+1 pre-aligned phase shifted clock signals each have a fundamental frequency equal to 2/(2N+1) times the fundamental frequency of the input clock signal.

In some embodiments, the 2N+1 pre-aligned phase shifted clock signals each have a pulse width substantially equal to a period of the input clock signal.

In some embodiments, the 2N+1 pre-aligned phase shifted clock signals are generated based on 2(2N+1) intermediate phase shifted clock signals each having a fundamental frequency equal to 1/(2N+1) times the fundamental frequency of the input clock signal.

In some embodiments, the 2N unique shifted clock signals each have a fundamental frequency equal to 2/(2N+1) times the fundamental frequency of the input clock signal.

In some embodiments, the 2N unique shifted clock signals each have a pulse width substantially equal to twice a period of the input clock signal.

In some embodiments, each of the 2N unique shifted clock signals corresponds with a phase shifted version of one of the 2N+1 pre-aligned phase shifted clock signals.

In some embodiments, the output clock signal has a pulse width substantially equal to twice a period of the input clock signal.

Another inventive aspect is a clock divider circuit configured to generate an output clock signal having a fundamental frequency which is substantially equal to a fundamental frequency of an input clock signal divided by a factor of (2N+1)/2N, where N is an integer. The clock divider circuit includes a divide by 2N+1 circuit configured to generate 2(2N+1) intermediate phase shifted clock signals, a multiply by 2 circuit configured to receive the 2(2N+1) intermediate phase shifted clock signals and to generate 2N+1 pre-aligned phase shifted clock signals based at least in part on the received 2(2N+1) intermediate phase shifted clock signals, a phase adjust circuit configured to receive the 2N 30 1 pre-aligned phase shifted clock signals and to generate 2N unique phase shifted clock signals based at least in part on the received 2N+1 pre-aligned phase shifted clock signals, where the 2N unique phase shifted clock signals are substantially separated in phase by 360/2N degrees, and a multiply by 2N/2 circuit configured to receive the 2N unique phase shifted clock signals and to generate the output clock signal based at least in part on the received 2N unique phase shifted clock signals.

In some embodiments, the divide by 2N+1 circuit includes first and second barrel shifter circuits configured to shift in response to the input clock signal.

In some embodiments, the multiply by 2 circuit includes a plurality of logic circuits each configured to perform a logical OR function on a plurality of the 2(2N+1) intermediate phase shifted clock signals.

In some embodiments, the phase adjust circuit includes a plurality of delay circuits configured to generate delayed versions of the 2N+1 pre-aligned phase shifted clock signals.

In some embodiments, a delay of the delay circuits are controlled so as to cause a first of the delayed versions of the 2N+1 pre-aligned phase shifted clock signals substantially overlaps a second of the delayed versions of the 2N+1 pre-aligned phase shifted clock signals.

In some embodiments, the multiply by 2N/2 circuit includes a plurality of first logic circuits each configured to perform a logical OR function on a plurality of logic signals generated based on the 2N unique phase shifted clock signals.

In some embodiments, the multiply by 2N/2 circuit includes a plurality of second logic circuits each configured to perform a logical AND function on a plurality of the 2N unique phase shifted clock signals to generate the logic signals.

In some embodiments, the output clock signal is differential, and where the multiply by 2N/2 circuit includes a non-overlap circuit configured to cause the differential output clock signal to be non-overlapping.

Another inventive aspect is a method of operating a communication circuit. The method includes, with a clock divider circuit, generating an output clock signal having a fundamental frequency which is substantially equal to a fundamental frequency of an input clock signal divided by a factor of (2N+1)/2N, where N is an integer, and where generating the output clock signal includes generating 2N+1 pre-aligned phase shifted clock signals based at least in part on the input clock signal, generating 2N unique phase shifted clock signals based at least in part on the 2N+1 pre-aligned phase shifted clock signals, where the 2N unique phase shifted clock signals are substantially separated in phase by 360/2N degrees, and generating the output clock signal based at least in part on the 2N unique phase shifted clock signals, and with a mixer, receiving the output clock signal.

In some embodiments, the 2N+1 pre-aligned phase shifted clock signals each have a fundamental frequency equal to 2/(2N+1) times the fundamental frequency of the input clock signal.

In some embodiments, the 2N+1 pre-aligned phase shifted clock signals are generated based on 2(2N+1) intermediate phase shifted clock signals each having a fundamental frequency equal to 1/(2N+1) times the fundamental frequency of the input clock signal.

In some embodiments, the 2N unique shifted clock signals each have a fundamental frequency equal to 2/(2N+1) times the fundamental frequency of the input clock signal.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

As discussed in further detail below, embodiments discussed herein illustrate circuits and methods for generating clocks which have frequencies that are non-integer fractions of a reference clock.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 1:
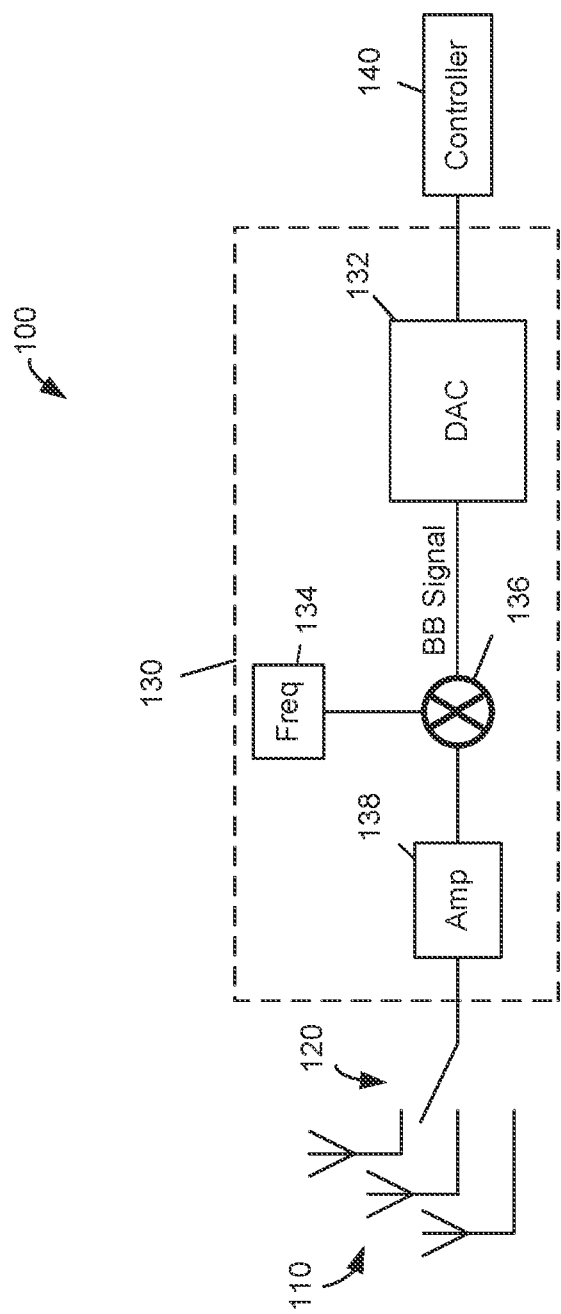
FIG. 1 is a schematic diagram of a transmitter circuit according to an embodiment.

FIG. 1 is a schematic diagram of an embodiment of a transmitter circuit 100 according to an embodiment. Transmitter circuit 100 includes antenna or antenna array 110, switch 120, RF chain 130, and controller 140. Transmitter circuit 100 illustrates a particular example. Other embodiments of transmitter circuits may be used.

Antenna or antenna array 110 may be any antenna or antenna array. For example, in some embodiments, antenna or antenna array 110 includes 1, 2, 3, 4, or more antennas. In some embodiments, antenna or antenna array 110 includes a linear antenna array. In some embodiments, antenna or antenna array 110 includes a two dimensional antenna array, for example, having multiple rows of linear antenna arrays.

In embodiments where antenna or antenna array 110 includes one antenna, the one antenna may be connected directly to RF chain 130, and switch 120 may be omitted. In embodiments where antenna or antenna array 110 includes multiple antennas, each antenna may be directly connected to a separate RF chain. Each of the RF chains may have the features of RF chain 130.

Antenna or antenna array 110 may be configured to transmit RF signals to a receiver circuit. The RF signals include a high frequency signal at a carrier frequency modulated with a low frequency information signal. The high frequency signal is transmitted by one of the antennas from antenna or antenna array 110, for example, according to a programmable electrical connection formed by switch 120, as controlled by controller 140.

Controller 140 is configured to provide a digital signal to RF chain 130, where the digital signal encodes the information signal to be transmitted by antenna or antenna array 110.

RF chain 130 includes digital to analog converter circuit (DAC) 132, mixer 136, frequency synthesizer 134, and power amplifier (PA) 138. RF chain 130 is an example only, and embodiments of other RF chains may alternatively be used. For example, in some embodiments, one or more amplifiers, and/or filters may be included, as understood by those of skill in the art.

The digital signal is processed by the digital to analog converter 132 to generate an analog baseband signal (BB signal) representing the digital signal, using techniques known in the art. Various digital to analog converter structures known in the art may be used.

Mixer 136 receives the analog baseband signal output from the digital to analog converter 132 and an oscillator signal at the carrier frequency generated by frequency synthesizer 134. In response to the analog baseband signal and the oscillator signal, mixer 136 up converts the analog baseband signal from the analog-to-digital converter 132 to a high frequency signal, using techniques known in the art. Various mixer structures known in the art may be used. The resulting high frequency signal is at the carrier frequency in this modulated so as to include the information of the low frequency information signal.

Power amplifier 138 is configured to receive the high frequency signal and to drive the high frequency signal to one of the antennas from antenna or antenna array 110, for example, according to a programmable electrical connection formed by switch 120, as controlled by controller 140. The power amplifier 138 drives the high frequency signal to one of the antennas using techniques known in the art. Various power amplifier structures known in the art may be used.

As understood by those of skill in the art, using communication connectivity not illustrated in FIG. 1, control signals from controller 140 may control certain variable functionality of switch 120, power amplifier 138, frequency synthesizer 134, mixer 136, and digital to analog converter 132, for example, as understood by those of skill in the art.

The control signals from controller 140 may, for example, control switch 120 to control which of multiple antennas RF chain 130 drives the high frequency signal with.

In embodiments having multiple antennas each connected to one of multiple RF chains, controller 140 may generate control signals for each of the RF chains.

Figure 2:
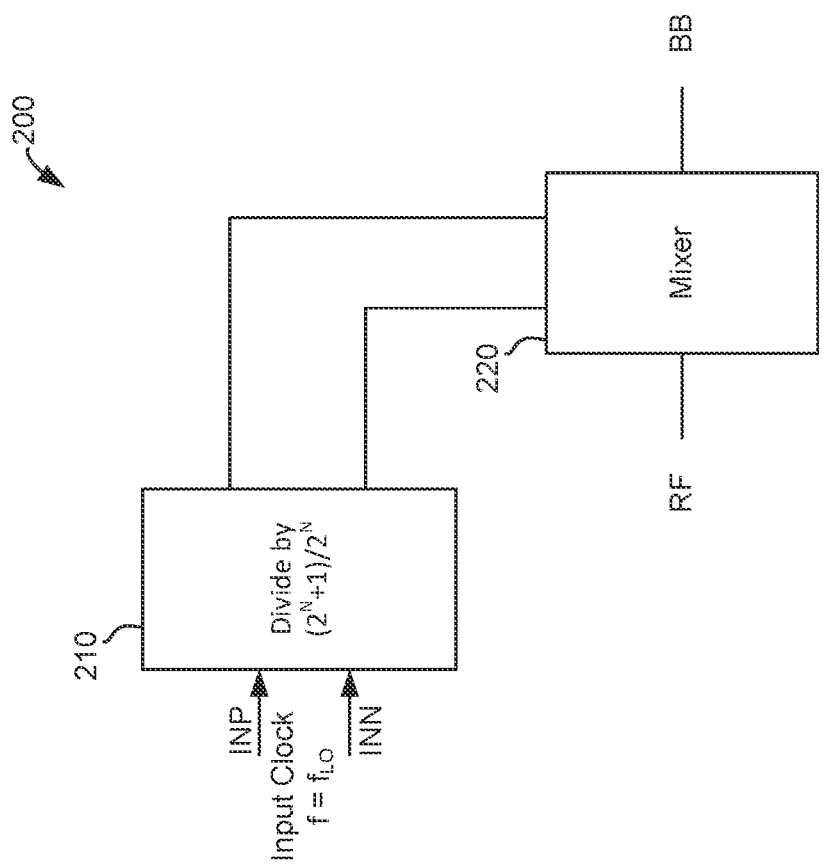
FIG. 2 illustrates a schematic diagram of a portion of a transmitter or receiver circuit according to some embodiments.

FIG. 2 illustrates a schematic diagram of a portion 200 of a frequency synthesizer circuit of a transmitter or receiver circuit according to some embodiments. The frequency synthesizer circuit may have features similar or identical to frequency synthesizer 134 of FIG. 1. The circuit portion 200 includes a clock divider 210, which may, for example, be included in frequency synthesizer 134 of FIG. 1. The circuit portion also includes a mixer 220. The mixer 220 may have features similar or identical to mixer 136 of FIG. 1. The mixer can be any mixer circuit known to those of skill in the art.

The clock divider 210 receives an input differential clock signal INP–INN generated, for example, at least partly by a local oscillator circuit. The received input differential clock signal has a fundamental frequency, such as an RF frequency. Based on the received input differential clock signal, the clock divider 210 generates an output differential clock signal having a frequency which is equal to the fundamental frequency divided by $(2^N+1)/2^N$, where N is an integer.

The mixer 220 is configured to receive the output differential clock signal from the clock divider 210 and to up convert or down convert an information carrying signal, for example, between the RF frequency and a baseband frequency.

Figure 3:
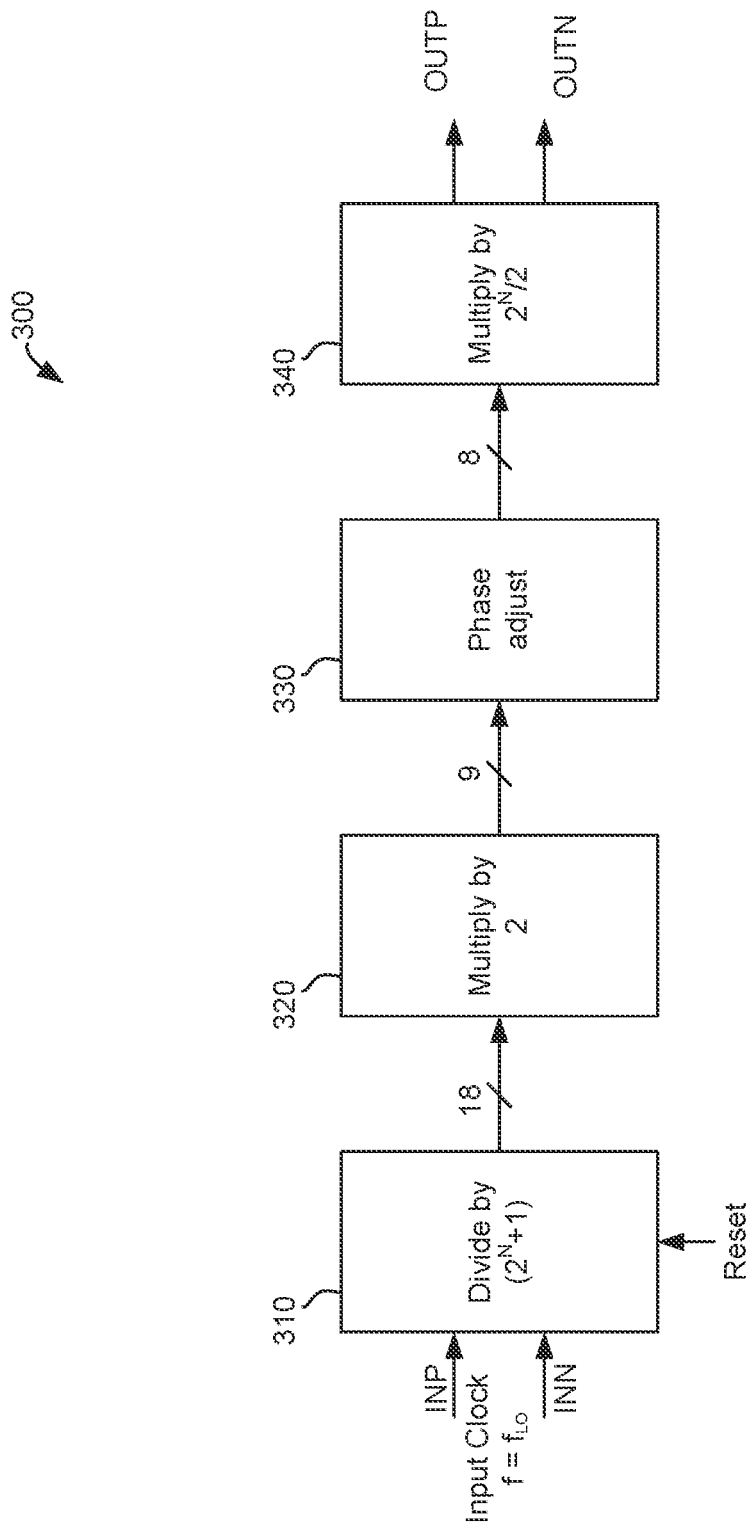
FIG. 3 illustrates a schematic diagram of a clock divider circuit according to some embodiments.

FIG. 3 illustrates a schematic diagram of a clock divider circuit 300 according to some embodiments. The clock divider circuit 300 may be used as or as part of the clock divider in the clock divider 210 of FIG. 2. In some embodiments, the clock divider 210 of FIG. 2 uses circuits other than that specifically illustrated in FIG. 3.

The clock divider circuit 300 of FIG. 3 divides the input differential clock by 9/8. The illustrated circuit embodiments may be modified by those of skill in the art to divide the input differential clock by other factors, such as any factor characterized by $(2^N+1)/2^N$, where N is an integer. In the illustrated example embodiment, N is equal to 3. In other implementations, N may be a different number.

The clock divider circuit 300 of FIG. 3 receives an input differential clock signal generated, for example, at least partly by a local oscillator circuit. The received input differential clock signal has a fundamental frequency, such as an RF frequency. Based on the received input differential clock signal, the clock divider circuit 300 generates an output differential clock signal OUTP–OUTN having a frequency which is equal to the fundamental frequency divided by $(2^3+1)/2^3=9/8$.

The clock divider circuit 300 of FIG. 3 includes a divide by $2^N+1$ circuit 310, a multiply by 2 circuit 320, a phase adjust circuit 330, and a multiply by $2^N/2$ circuit 340.

The divide by $2^N+1$ circuit 310 receives the input differential clock signal. In the illustrated embodiment, the divide by $2^N+1$ circuit 310 divides the input differential clock signal by 9, and generates 18 phase shifted clock signals, each having a frequency equal to the fundamental frequency divided by 9.

An embodiment of a divide by $2^N+1$ circuit which may be used as or partly as divide by $2^N+1$ 310 is discussed below. Other divide by $2^N+1$ circuits may be used.

The multiply by 2 circuit 320 receives the 18 phase shifted clock signals from the divide by $2^N+1$ circuit 310, and generates 9 phase shifted clock signals, where each of the nine phase shifted clock signals has a frequency equal to 2 times the fundamental frequency divided by 9.

An embodiment of a multiply by 2 circuit which may be used as or partly as multiply by 2 circuit 320 is discussed below. Other multiply by 2 circuits may be used.

In this embodiment, the phase adjust circuit 330 receives the 9 phase shifted clock signals from the multiply by 2 circuit 320, and generates eight phase shifted clock signals, where the eight phase shifted clock signals are separated in phase by a substantially same phase. Accordingly, the eight phase shifted clock signals are separated from one another by a phase equal or substantially equal to 360/8=45 degrees.

An embodiment of a phase adjust circuit which may be used as or partly as phase adjust circuit 330 is discussed below. Other phase adjust circuits may be used.

The multiply by $2^N/2$ circuit 340 receives the 8 phase shifted clock signals from the phase adjust circuit 330, and generates the output differential clock signal OUTP–OUTN, where the output differential clock signal has a frequency which is equal to the fundamental frequency multiplied by $1/(2^N+1)\times 2\times 2^N/2$/or divided by $(2^N+1)/2^N$.

An embodiment of a multiply by $2^N/2$ circuit which may be used as or partly as multiply by $2^N/2$ circuit 340 is discussed below. Other multiply by $2^N/2$ circuits may be used.

Figure 4:
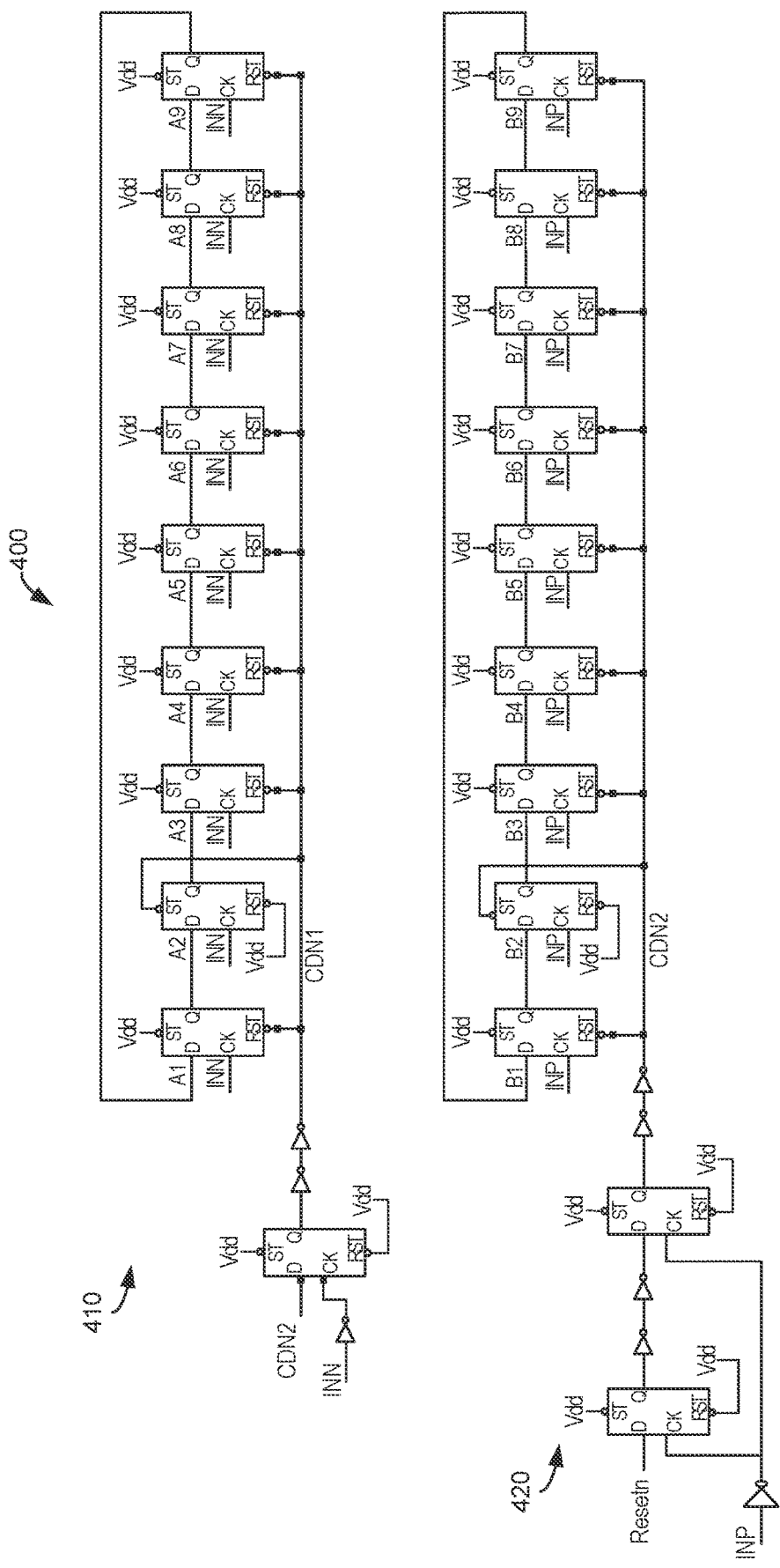
FIG. 4 illustrates a schematic diagram of a clock divider circuit according to some embodiments.

FIG. 4 illustrates a schematic diagram of a divide by $2^N+1$ circuit 400 according to some embodiments configured to divide an input clock by $2^N+1$ where N=3. Divide by $2^N+1$ circuit 400 may be used as divide by $2^N+1$ circuit 310 of FIG. 3. In some embodiments, other divide by $2^N+1$ circuits are used as divide by $2^N+1$ circuit 310 of FIG. 3.

The divide by $2^N+1$ circuit 400 illustrated in FIG. 4 receives the input differential clock signal INP–INN. In the illustrated embodiment, the divide by $2^N+1$ circuit 400 divides the input differential clock signal by 9 ($2^N+1$), and generates 18 $2/(2^N+1)$ phase shifted clock signals, each having a frequency equal to the fundamental frequency divided by 9. In addition, each of the phase shifted clock signals has a pulse width substantially equal to a period of the input clock signal.

In the illustrated embodiment, the divide by $2^N+1$ circuit 400 includes first and second resettable barrel shifter circuits 410 and 420.

The first resettable barrel shifter circuit 410 includes nine resettable flip-flops, each configured to generate an output for a next flip-flop based on an input from a previous flip-flop in response to a clock input at input INN, as illustrated. The first resettable barrel shifter circuit 410 is reset such that the output A3 is high and its other outputs A1, A2, and A4-A9 are low.

The second resettable barrel shifter circuit 420 includes nine resettable flip-flops, each configured to generate an output for a next flip-flop based on an input from a previous flip-flop in response to a clock input INP, as illustrated. The second resettable barrel shifter circuit 410 is reset such that the output B3 is high and its other outputs B1, B2, and B4-B9 are low.

Figure 5:
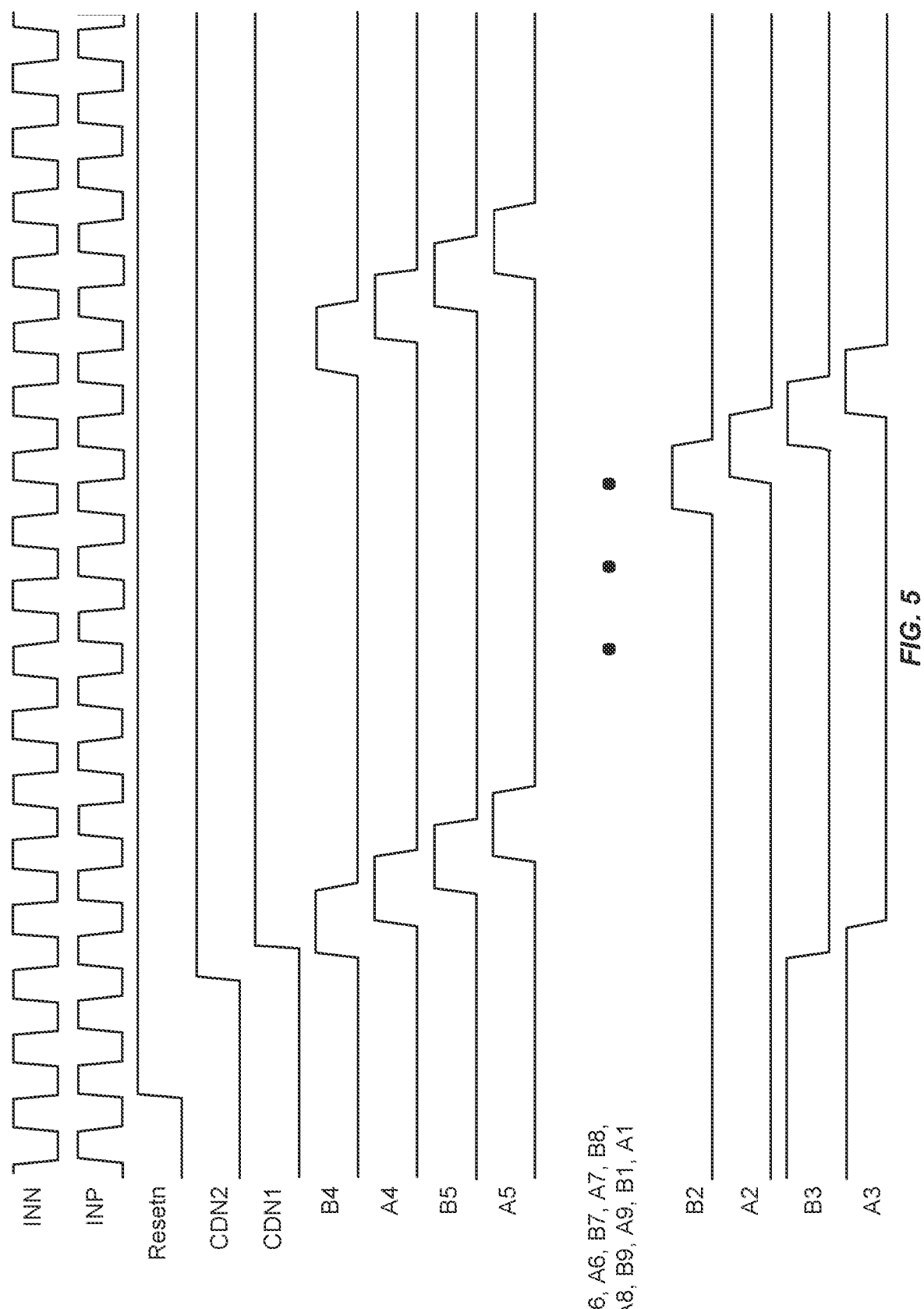
FIG. 5 illustrates a waveform diagram illustrating operation of the clock divider circuit of FIG. 4 according to some embodiments.

FIG. 5 illustrates a waveform diagram illustrating operation of the clock divider circuit 400 of FIG. 4 according to some embodiments.

As illustrated, while reset signals CDN1 and CDN2 are low, outputs B3 and A3 are high, and the other outputs B1, B2, B4-B9, A1, A2, and A4-A9 are low. Two falling edges of input clock INP after reset signal Resetn goes high, reset signal CDN2 goes high. In addition, one falling edge of input clock INN after reset signal CDN2 goes high, reset signal CDN1 goes high. Thereafter, while reset signal CDN1 is high, one of the Ax outputs of the first barrel shifter circuit 410 is high, where which of the Ax outputs is high rotates through the Ax outputs, starting with output A4, and changes in response to each subsequent falling edge of input clock INN. In addition, while reset signal CDN2 is high, one of the Bx outputs of the second barrel shifter circuit 420 is high, where which of the Bx outputs is high rotates through the Bx outputs, starting with output B4, and changes in response to each subsequent falling edge of input clock INP.

Figure 6:
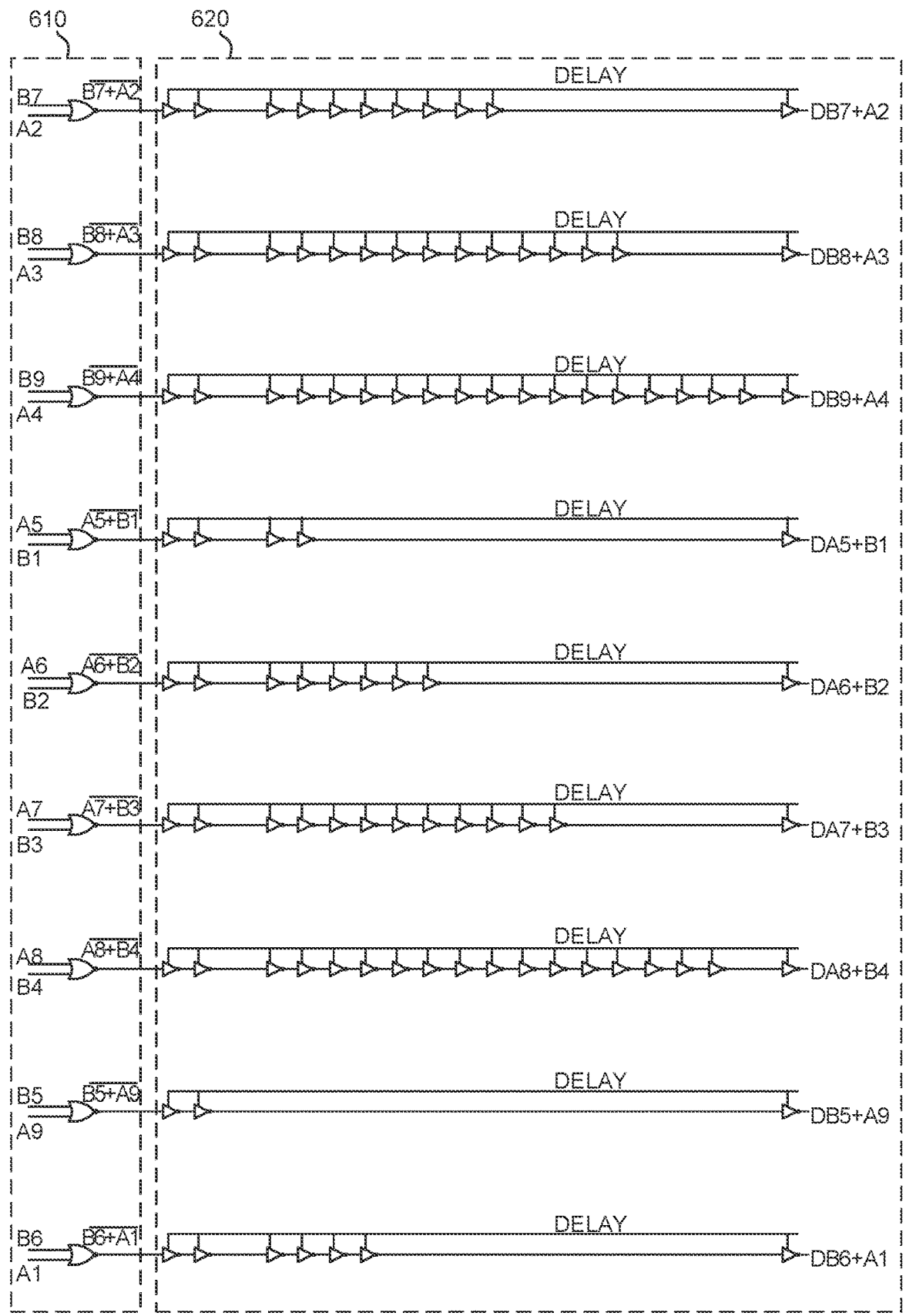
FIG. 6 illustrates a schematic diagram of a clock multiplier and adjustable delay circuit according to some embodiments.

FIG. 6 illustrates a schematic diagram of a clock multiplier circuit 610 and an adjustable delay circuit 620 according to some embodiments. Clock multiplier circuit 610 may be used as or as part of multiply by 2 circuit 320 of FIG. 3. In some embodiments, other clock multiplier circuits are used as or as part of multiply by 2 circuit 320 of FIG. 3. Adjustable delay circuit 620 may be used as or as part of phase adjust circuit 330 of FIG. 3. In some embodiments, other adjustable delay circuits are used as or as part of phase adjust circuit 330 of FIG. 3.

The clock multiplier circuit 610 and adjustable delay circuit 620 form nine signal paths each comprising one of nine ($2^N+1$) multiply by 2 portions of clock multiplier circuit 610 and one of nine phase adjust portions of adjustable delay circuit 620.

Each multiply by 2 portion of clock multiplier circuit 610 receives one output Ax from the first barrel shifter circuit 410 as a first input and one output Bx from the second barrel shifter circuit 420 as a second input. In this embodiment, each multiply by 2 portion includes a NOR gate that performs a NOR logic function on the first and second inputs. Accordingly, the multiply by 2 portions of clock multiplier circuit 610 each receive two of the 18 phase shifted clock signals from the clock divider circuit 400. In addition, the multiply by 2 portions of clock multiplier circuit 610 each generate a multiplied clock signal/(Bx+Ax) or/(Ax+Bx) having a frequency equal to 2 times the fundamental frequency divided by 9.

Each of the nine ($2^N+1$) phase adjust portion of clock multiplier circuits 620 receives one of the multiplied clock signals/(Bx+Ax) or/(Ax+Bx), and generates a phase shifted clock signal D/(Bx+Ax) or D/(Ax+Bx). Each phase adjust portion comprises a number of buffer or inverter stages, where a delay of each stage is influenced or controlled by a control signal DELAY.

The delay of the buffer or inverter stages are controlled using the control signal DELAY such that a first of the phase shifted clock signals D/(Bx+Ax) or D/(Ax+Bx) overlaps a last of the phase shifted clock signals D/(Bx+Ax) or D/(Ax+Bx). Accordingly, in the illustrated embodiment, the nine phase adjust portions receive the nine phase shifted clock signals D/(Bx+Ax) or D/(Ax+Bx) generated by the nine multiply by 2 portions, and generate the nine phase shifted clock signals D/(Bx+Ax) or D/(Ax+Bx), where two of the phase shifted clock signals D/(Bx+Ax) or D/(Ax+Bx) overlap. Accordingly, the nine phase adjust portions generate eight unique phase shifted clock signals D/(Bx+Ax) or D/(Ax+Bx), where the eight unique phase shifted clock signals D/(Bx+Ax) or D/(Ax+Bx) are separated in phase by phase equal or substantially equal to 360/8=45 degrees.

Figure 7:
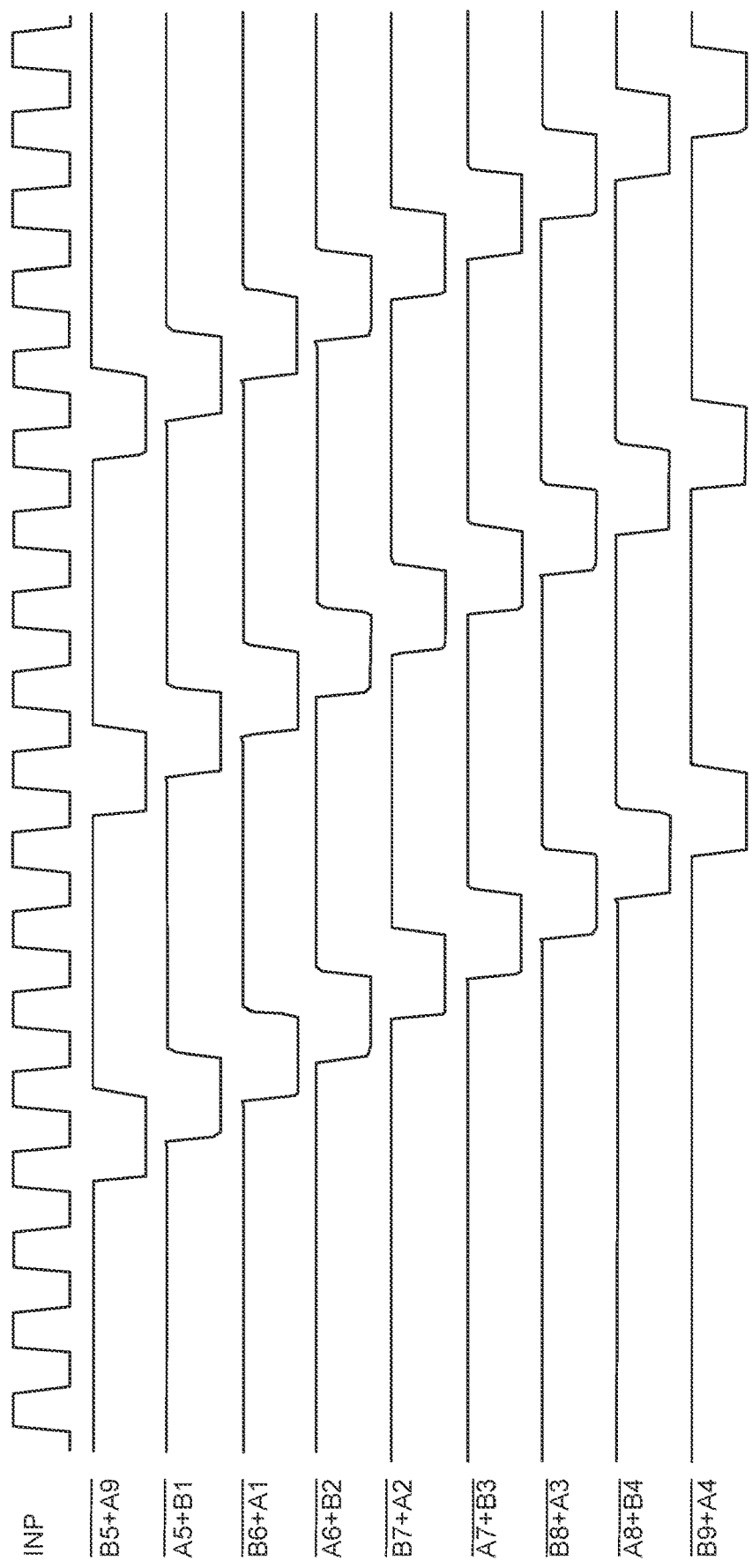
FIGS. 7 and 8 illustrate a waveform diagrams illustrating operation of the clock multiplier and adjustable delay circuit of FIG. 6 according to some embodiments.

FIG. 7 illustrates a waveform diagram illustrating multiplied clock signal outputs/(Bx+Ax) or/(Ax+Bx) of the multiply by 2 portions of clock multiplier circuit 610 of FIG. 6 according to some embodiments. As shown, each of the multiplied clock signals/(Bx+Ax) or/(Ax+Bx) has a frequency equal to 2 times the fundamental frequency divided by 9 ($2^N+1$). In addition, each of the multiplied clock signals/(Bx+Ax) or/(Ax+Bx) has a pulse width substantially equal to a period of the input clock signal.

Figure 8:
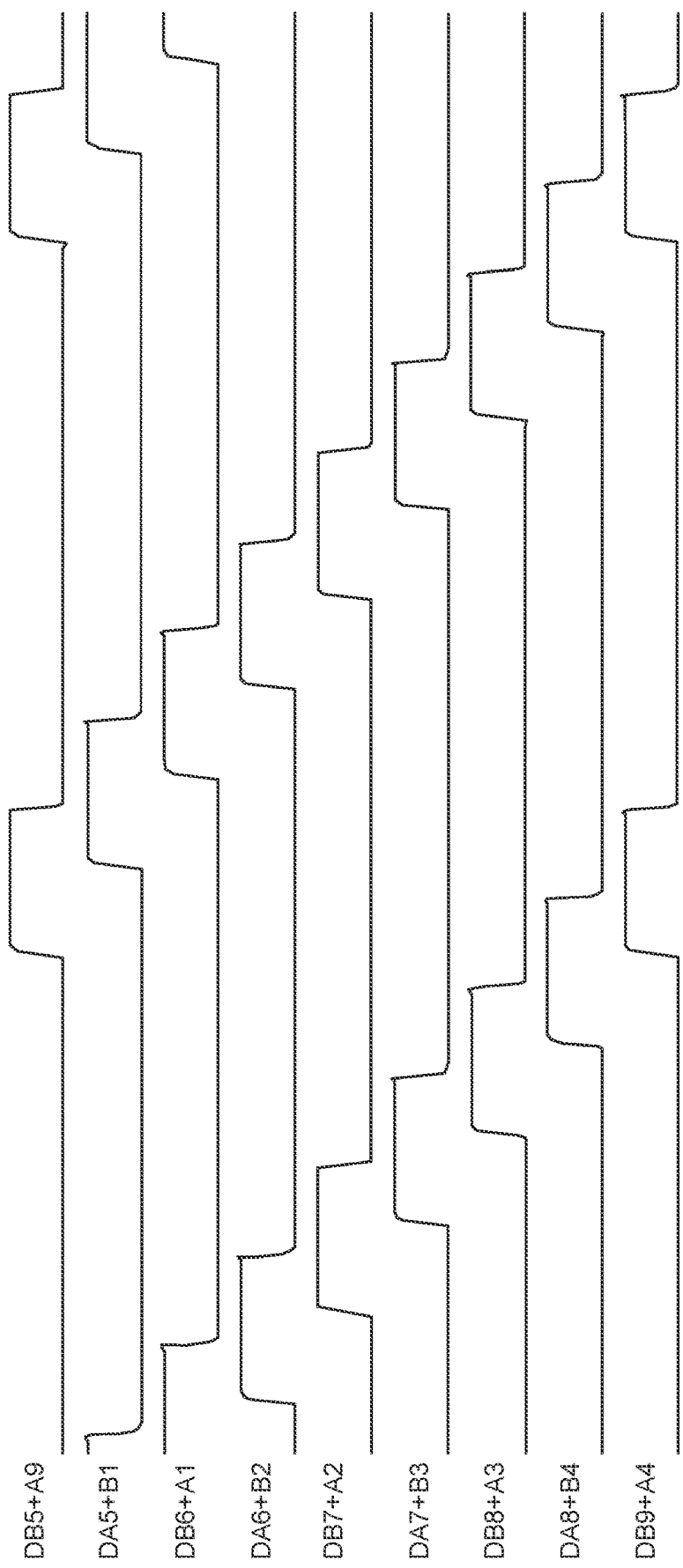

FIG. 8 illustrates a waveform diagram illustrating the phase shifted clock signals D/(Bx+Ax) or D/(Ax+Bx) of the phase adjust portions of clock multiplier circuit 610 of FIG. 6 according to some embodiments. As shown, a first of the phase shifted clock signals DB5+A9 is aligned with and overlaps a second of the phase shifted clock signals DB9+A4. Accordingly, the eight unique phase shifted clock signals DB5+A9, DA5+B1, DB6+A1, DA6+B2, DB7+A2, DA7+B3, DB8+A3, and DA8+B4 are separated in phase by same phase, which is equal or substantially equal to 360/8=45 degrees. Furthermore, each of the eight unique phase shifted clock signals DB5+A9, DA5+B1, DB6+A1, DA6+B2, DB7+A2, DA7+B3, DB8+A3, and DA8+B4 has a frequency equal to 2 times the fundamental frequency divided by 9 ($2^N+1$), and has a pulse width substantially equal to a period of the input clock signal.

The alignment of phase shifted clock signals DB5+A9 and DB9+A4 occurs by controlling the delays of the buffer or inverter stages of the phase adjust portions of adjustable delay circuit 620 using the control signal DELAY. For example, the control signal DELAY may be an analog voltage and the buffer or inverter stages may have delays influenced or controlled by the analog voltage of the control signal DELAY. The analog voltage of the control signal DELAY may be generated with a phase detect circuit which detects a phase difference between phase shifted clock signals DB5+A9 and DB9+A4 and increases or decreases the analog voltage of the control signal DELAY based on the detected phase difference, where the increase or decrease in the analog voltage of the control signal DELAY decreases the phase difference between phase shifted clock signals DB5+A9 and DB9+A4. The phase detect circuit may, for example, comprise a phase frequency detector PFD circuit, or the like.

Figure 9:
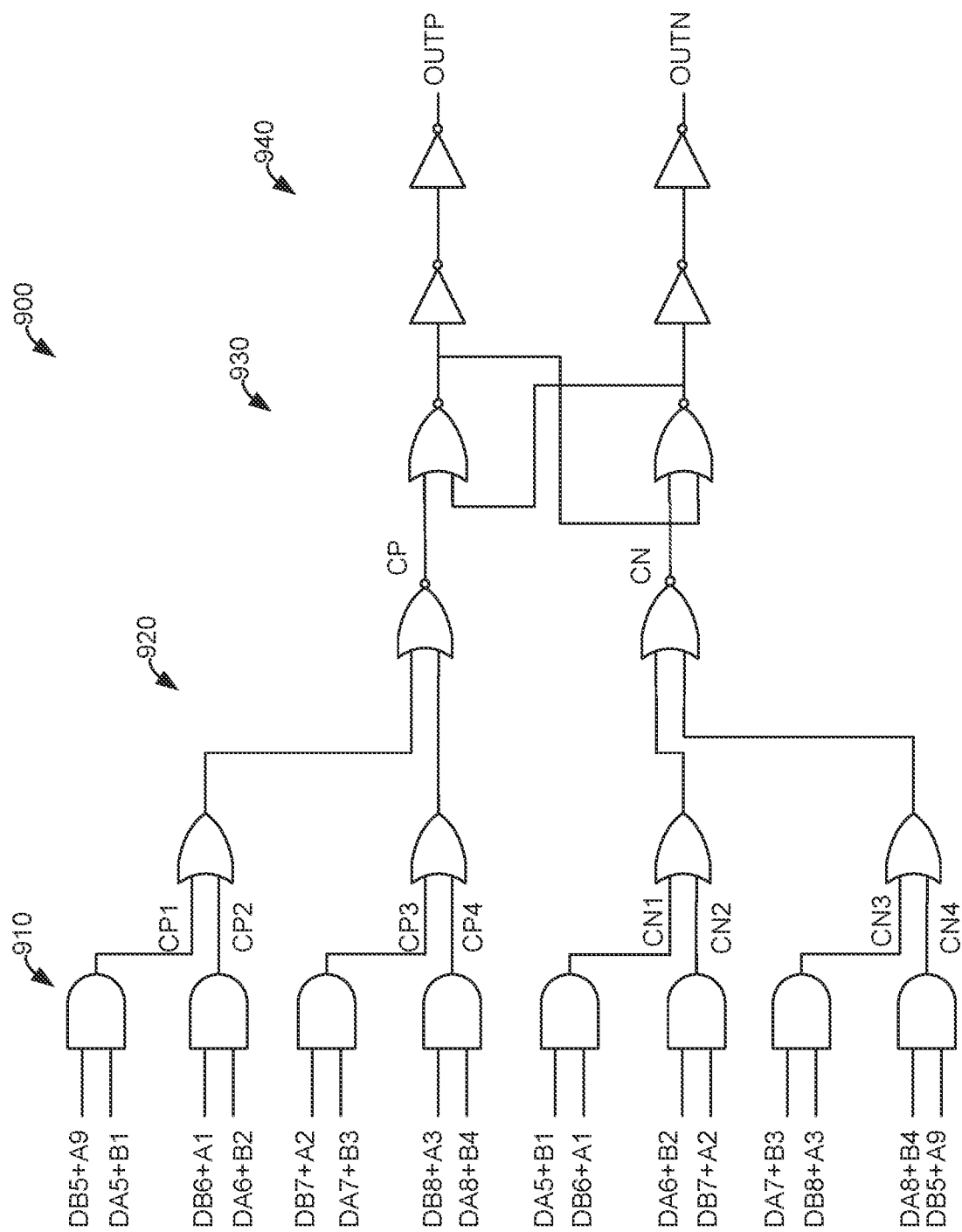
FIG. 9 illustrates a schematic diagram of a clock multiplier circuit according to some embodiments.

FIG. 9 illustrates a schematic diagram of a clock multiplier circuit 900 according to some embodiments. Clock multiplier circuit 900 may be used as or as part of multiply by $2^N/2$ circuit 340 of FIG. 3. In some embodiments, other clock multiplier circuits are used as or as part of multiply by $2^N/2$ circuit 340 of FIG. 3. In this embodiment, the clock multiplier circuit multiplies the frequency of the clock by $2^N/2=4$.

The AND gates 910 of the clock multiplier circuit 900 perform an AND logic function on adjacent phase shifted clock signals DB5+A9 and DA5+B1, DB6+A1 and DA6+B2, DB7+A2 and DA7+B3, DB8+A3 and DA8+B4, DA5+B1 and DB6+A1, DA6+B2 and DB7+A2, DA7+B3 and DB8+A3, and DA8+B4 and DB5+A9 generated by the phase adjust portions of clock multiplier circuit 610 of FIG. 6 to generate eight clock signals CP1, CP2, CP3, CP4, CN1, CN2, CN3, and CN4. Furthermore, each of the eight clock signals CP1, CP2, CP3, CP4, CN1, CN2, CN3, and CN4 has a frequency equal to 2 times the fundamental frequency divided by 9 ($2^N+1$), and has a pulse width substantially equal to half the period of the input clock signal.

The OR gates 920 of the clock multiplier circuit 900 perform a first OR logic function on a first group of clock signals including clock signals CP1, CP2, CP3, and CP4 to generate a first OR'd clock signal CP, and a second OR logic function on a second group of clock signals including clock signals CN1, CN2, CN3, and CN4 to generate a second OR'd clock signal CN. Furthermore, each of clock signals CP and CN has a frequency equal to 4 ($2^N$) times the fundamental frequency divided by 9 ($2^N+1$), and has a pulse width substantially equal to half the period of the input clock signal.

The cross-coupled NOR gates 930 of the clock multiplier circuit 900 receive first and second OR'd clock signals CP and CN, and generate signals for inverters 940, based on which, inverters 940 generate output clock signals OUTP and OUTN. The cross-coupled NOR gates 930 form a non-overlap circuit and ensure that adjacent pulses output clock signals OUTP and OUTN are desirably non-overlapping. Furthermore, each of output clock signals OUTP and OUTN has a frequency equal to 4 ($2^N$) times the fundamental frequency divided by 9 ($2^N+1$), and has a pulse width substantially equal to half the period of the input clock signal.

Figure 10:
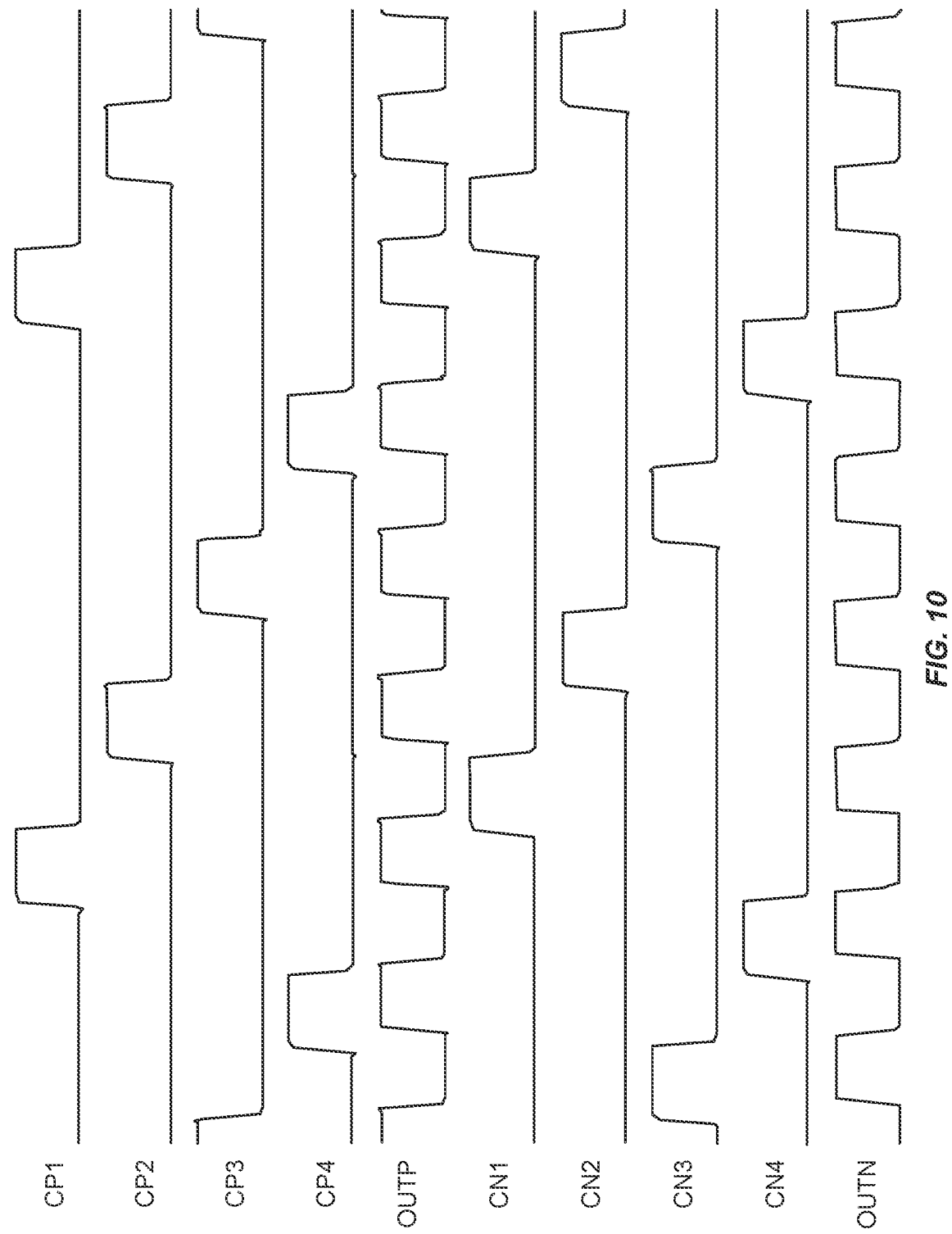
FIG. 10 illustrates a waveform diagram illustrating operation of the clock multiplier circuit of FIG. 9 according to some embodiments.

FIG. 10 illustrates a waveform diagram illustrating operation of the clock multiplier circuit 900 of FIG. 9 according to some embodiments.

As shown, the positive pulses of the CP1-CP4 and CN1-CN4 clock signals are narrower than the phase shifted clock signals DB5+A9, DA5+B1, DB6+A1, DA6+B2, DB7+A2, DA7+B3, DB8+A3, and DA8+B4 of FIG. 8 because of the ANDing operation of the AND gates 910. In addition, the output clock signals OUTP and OUTN have a frequency which is four times the frequency of the phase shifted clock signals DB5+A9, DA5+B1, DB6+A1, DA6+B2, DB7+A2, DA7+B3, DB8+A3, and DA8+B4 of FIG. 8 because of the ORing operation of the OR gates.

Accordingly, in this embodiment, the output clock signals OUTP and OUTN are generated by dividing the input differential clock INP–INN by ($2^N+1$) with the divide by $2^N+1$ circuit 400, multiplying by 2 with the multiply by 2 portions of clock multiplier circuit 610, phase adjusting to generate $2^N$ unique phase shifted clocks with the phase adjust portions of adjustable delay circuit 620, and multiplying by $2^N/2$ with the multiplier circuit 900.

As a result, the output differential clock signal has a frequency which is equal to the fundamental frequency of the input differential clock signal multiplied by $2 \times 2^N/2/(2^N+1)$ or divided by $(2^N+1)/2^N$. As a result, the fundamental frequency of the output differential clock signal and at least its lower order harmonics are different from the fundamental frequency of the input differential clock signal and at least its lower order harmonics.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combina-

What is claimed is:

1. A communication circuit, comprising:
   a clock input;
   a clock divider circuit configured to generate an output clock signal having a fundamental frequency which is substantially equal to a fundamental frequency of an input clock signal received at the clock input divided by a factor of $(2^N+1)/2^N$, wherein N is an integer, and wherein the clock divider circuit is configured to:
   generate $2^N+1$ pre-aligned phase shifted clock signals based at least in part on the input clock signal,
   generate $2^N$ unique phase shifted clock signals based at least in part on the $2^N+1$ pre-aligned phase shifted clock signals, wherein the $2^N$ unique phase shifted clock signals are substantially separated in phase by $360/2^N$ degrees, and
   generate the output clock signal based at least in part on the $2^N$ unique phase shifted clock signals; and
   a mixer, configured to receive the output clock signal.

2. The communication circuit of claim 1, wherein the $2^N+1$ pre-aligned phase shifted clock signals each have a fundamental frequency equal to $2/(2^N+1)$ times the fundamental frequency of the input clock signal.

3. The communication circuit of claim 1, wherein the $2^N+1$ pre-aligned phase shifted clock signals each have a pulse width substantially equal to a period of the input clock signal.

4. The communication circuit of claim 1, wherein the $2^N+1$ pre-aligned phase shifted clock signals are generated based on $2(2^N+1)$ intermediate phase shifted clock signals each having a fundamental frequency equal to $1/(2^N+1)$ times the fundamental frequency of the input clock signal.

5. The communication circuit of claim 1, wherein the $2^N$ unique shifted clock signals each have a fundamental frequency equal to $2/(2^N+1)$ times the fundamental frequency of the input clock signal.

6. The communication circuit of claim 1, wherein the $2^N$ unique shifted clock signals each have a pulse width substantially equal to twice a period of the input clock signal.

7. The communication circuit of claim 1, wherein each of the $2^N$ unique shifted clock signals corresponds with a phase shifted version of one of the $2^N+1$ pre-aligned phase shifted clock signals.

8. The communication circuit of claim 1, wherein the output clock signal has a pulse width substantially equal to twice a period of the input clock signal.

9. A clock divider circuit configured to generate an output clock signal having a fundamental frequency which is substantially equal to a fundamental frequency of an input clock signal divided by a factor of $(2^N+1)/2^N$, wherein N is an integer, and wherein the clock divider circuit comprises:
   a divide by $2^N+1$ circuit configured to generate $2(2^N+1)$ intermediate phase shifted clock signals;
   a multiply by 2 circuit configured to receive the $2(2^N+1)$ intermediate phase shifted clock signals and to generate $2^N+1$ pre-aligned phase shifted clock signals based at least in part on the received $2(2^N+1)$ intermediate phase shifted clock signals;
   a phase adjust circuit configured to receive the $2^N+1$ pre-aligned phase shifted clock signals and to generate $2^N$ unique phase shifted clock signals based at least in part on the received $2^N+1$ pre-aligned phase shifted clock signals, wherein the $2^N$ unique phase shifted clock signals are substantially separated in phase by $360/2^N$ degrees; and
   a multiply by $2^N/2$ circuit configured to receive the $2^N$ unique phase shifted clock signals and to generate the output clock signal based at least in part on the received $2^N$ unique phase shifted clock signals.

10. The clock divider circuit of claim 9, wherein the divide by $2^N+1$ circuit comprises first and second barrel shifter circuits configured to shift in response to the input clock signal.

11. The clock divider circuit of claim 9, wherein the multiply by 2 circuit comprises a plurality of logic circuits each configured to perform a logical OR function on a plurality of the $2(2^N+1)$ intermediate phase shifted clock signals.

12. The clock divider circuit of claim 9, wherein the phase adjust circuit comprises a plurality of delay circuits configured to generate delayed versions of the $2^N+1$ pre-aligned phase shifted clock signals.

13. The clock divider circuit of claim 12, wherein a delay of the delay circuits are controlled so as to cause a first of the delayed versions of the $2^N+1$ pre-aligned phase shifted clock signals substantially overlaps a second of the delayed versions of the $2^N+1$ pre-aligned phase shifted clock signals.

14. The clock divider circuit of claim 9, wherein the multiply by $2^N/2$ circuit comprises a plurality of first logic circuits each configured to perform a logical OR function on a plurality of logic signals generated based on the $2^N$ unique phase shifted clock signals.

15. The clock divider circuit of claim 14, wherein the multiply by $2^N/2$ circuit comprises a plurality of second logic circuits each configured to perform a logical AND function on a plurality of the $2^N$ unique phase shifted clock signals to generate the logic signals.

16. The clock divider circuit of claim 9, wherein the output clock signal is differential, and wherein the multiply by $2^N/2$ circuit comprises a non-overlap circuit configured to cause the differential output clock signal to be non-overlapping.

17. A method of operating a communication circuit, the method comprising:
   with a clock divider circuit, generating an output clock signal having a fundamental frequency which is substantially equal to a fundamental frequency of an input clock signal divided by a factor of $(2^N+1)/2^N$, wherein N is an integer, and wherein generating the output clock signal comprises:
   generating $2^N+1$ pre-aligned phase shifted clock signals based at least in part on the input clock signal,
   generating $2^N$ unique phase shifted clock signals based at least in part on the $2^N+1$ pre-aligned phase shifted clock signals, wherein the $2^N$ unique phase shifted clock signals are substantially separated in phase by $360/2^N$ degrees, and
   generating the output clock signal based at least in part on the $2^N$ unique phase shifted clock signals; and
   with a mixer, receiving the output clock signal.

18. The method of claim 17, wherein the $2^N+1$ pre-aligned phase shifted clock signals each have a fundamental frequency equal to $2/(2^N+1)$ times the fundamental frequency of the input clock signal.

19. The method of claim 17, wherein the $2^N+1$ pre-aligned phase shifted clock signals are generated based on $2(2^N+1)$ intermediate phase shifted clock signals each having a fundamental frequency equal to $1/(2^N+1)$ times the fundamental frequency of the input clock signal.

20. The method of claim 17, wherein the $2^N$ unique shifted clock signals each have a fundamental frequency equal to $2/(2^N+1)$ times the fundamental frequency of the input clock signal.

* * * * *